United States Patent
Imanaka et al.

(10) Patent No.: US 10,962,597 B2
(45) Date of Patent: Mar. 30, 2021

(54) MEASUREMENT APPARATUS, ENERGY STORAGE APPARATUS, MEASUREMENT SYSTEM, AND OFFSET ERROR MEASUREMENT METHOD

(71) Applicant: GS Yuasa International Ltd., Kyoto (JP)

(72) Inventors: Yuki Imanaka, Kyoto (JP); Seiji Takai, Kyoto (JP); Masayuki Imura, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 0 days.

(21) Appl. No.: 16/766,550

(22) PCT Filed: Dec. 4, 2018

(86) PCT No.: PCT/JP2018/044505
§ 371 (c)(1),
(2) Date: May 22, 2020

(87) PCT Pub. No.: WO2019/111878
PCT Pub. Date: Jun. 13, 2019

(65) Prior Publication Data
US 2020/0379050 A1    Dec. 3, 2020

(30) Foreign Application Priority Data
Dec. 4, 2017    (JP) .............................. JP2017-232602

(51) Int. Cl.
*G01R 31/00* (2006.01)
*G01R 31/367* (2019.01)
(Continued)

(52) U.S. Cl.
CPC ......... *G01R 31/367* (2019.01); *G01R 31/007* (2013.01); *G01R 35/00* (2013.01);
(Continued)

(58) Field of Classification Search
USPC .......................................... 324/426; 329/134
See application file for complete search history.

(56) References Cited

U.S. PATENT DOCUMENTS

| 5,002,840 A | * | 3/1991 | Klebenow et al. ... H01M 10/12 |
| | | | 429/9 |
| 2006/0006850 A1 | * | 1/2006 | Inoue .................. H02J 2207/20 |
| | | | 323/265 |

(Continued)

FOREIGN PATENT DOCUMENTS

| JP | 2000-137062 A | 5/2000 |
| JP | 2003-068369 A | 3/2003 |

(Continued)

OTHER PUBLICATIONS

International Searching Authority, International Search Report and Written Opinion for International Application No. PCT/JP2018/044505, dated Feb. 26, 2019, (8 pages), Japan Patent Office, Tokyo, Japan.

(Continued)

*Primary Examiner* — Vincent Q Nguyen
(74) *Attorney, Agent, or Firm* — Alston & Bird LLP

(57) ABSTRACT

A measurement device 50 of an electrochemical element 30 that is connected, via a first switch 40, to a terminal part 22P having a load connected thereto, wherein: the measurement device 50 is provided with a current limitation unit 75 provided to a bypass path BP of the first switch 40, a current sensor 60 for measuring the current of the electrochemical element 30, and a processing unit 100; when a voltage difference ΔV between the voltage of the electrochemical element 30 and the voltage of the terminal part 22P is equal to or greater than a prescribed value, the current limitation unit 75 permits the supply of power to the load through the bypass path BP, and when the voltage difference ΔV is less than the prescribed value, the current limitation unit 75 cuts (Continued)

off the current to the bypass path BP; and in a period of time after the first switch 40 has been turned off and until the voltage difference $\Delta V$ reaches the prescribed value due to a change in voltage of the terminal part 22P because of discharging of a charge/discharge element 170 connected in parallel to the load, the processing unit 100 performs a measurement process to measure the offset error $\varepsilon$ of the current sensor 60.

8 Claims, 14 Drawing Sheets

(51) Int. Cl.
*G01R 35/00* (2006.01)
*H01M 10/42* (2006.01)
*H01M 10/48* (2006.01)
*H02J 7/00* (2006.01)

(52) U.S. Cl.
CPC ....... *H01M 10/4285* (2013.01); *H01M 10/48* (2013.01); *H02J 7/0047* (2013.01); *H01M 2220/20* (2013.01)

(56) References Cited

U.S. PATENT DOCUMENTS

| | | |
|---|---|---|
| 2013/0257062 A1 | 10/2013 | Sakakibara |
| 2018/0017628 A1 | 1/2018 | Takegami et al. |
| 2019/0301377 A1* | 10/2019 | Shibata .................. F02D 29/06 |

FOREIGN PATENT DOCUMENTS

| | | |
|---|---|---|
| JP | 2004-226154 A | 8/2004 |
| JP | 2005-077128 A | 3/2005 |
| JP | 2007-192723 A | 8/2007 |
| JP | 2008-072875 A | 3/2008 |
| JP | 2010-019805 A | 1/2010 |
| JP | 2011-209086 A | 10/2011 |
| JP | 2011-217543 A | 10/2011 |
| JP | 2013-209017 A | 10/2013 |
| JP | 2015-021861 A | 2/2015 |
| JP | 2017-083256 A | 5/2017 |
| WO | WO-2012/098968 A1 | 7/2012 |
| WO | WO-2016/132813 A1 | 8/2016 |

OTHER PUBLICATIONS

International Searching Authority, International Search Report and Written Opinion for International Application No. PCT/JP2018/044505, dated Feb. 26, 2019, (12 pages), Japanese Patent Office, Tokyo, Japan.

* cited by examiner

MEASUREMENT APPARATUS, ENERGY STORAGE APPARATUS, MEASUREMENT SYSTEM, AND OFFSET ERROR MEASUREMENT METHOD

CROSS REFERENCE TO RELATED APPLICATIONS

This application is a national stage application, filed under 35 U.S.C. § 371, of International Application No. PCT/JP2018/044505, filed Dec. 4, 2018, which international application claims priority to and the benefit of Japan Application No. 2017-232602, filed Dec. 4, 2017, the contents of both of which as are hereby incorporated by reference in their entireties.

BACKGROUND

Technical Field

The present invention relates to a technique for detecting the offset error of a current sensor.

Description of Related Art

The battery mounted in a vehicle estimates an SOC by integrating the current detected by a current sensor, as described in Patent Document JP-A-2017-83256.

BRIEF SUMMARY

A current sensor has an offset error indicating a numerical value other than zero even when the true value is zero. The offset error can be corrected by detecting the measurement value of the current sensor while the current is cut off. However, in order to measure the offset error, if the current is cut off, the power supply to the load is interrupted. The present invention has been completed based on the above circumstances, and has an object to measure the offset error of a current sensor while maintaining power supply to a load.

A measurement apparatus measures a current of an electrochemical device connected, via a first switch, to a terminal portion to which a load is connected. The apparatus includes a current limiting unit provided in a bypass path of the first switch, a current sensor configured to measure the current of the electrochemical device, and a processing unit. The current limiting unit allows power supply to the load through the bypass path when a voltage difference between a voltage of the electrochemical device and a voltage of the terminal portion is not less than a predetermined value, and makes the bypass path currentless when the voltage difference is less than the predetermined value. The processing unit performs measurement processing of measuring an offset error of the current sensor during a period until the voltage difference reaches the predetermined value due to a change in voltage of the terminal portion caused by discharging of a charge-discharge device connected in parallel with the load after the first switch is turned off.

The above technique can be applied to an energy storage apparatus, a measurement system, and an offset error measurement method. The techniques can be implemented in various forms such as offset error measurement programs and a recording medium recording the programs.

According to one aspect of the present invention, it is possible to measure an offset error while maintaining power supply to a load.

DETAILED DESCRIPTION OF VARIOUS EMBODIMENTS

Figure 1:
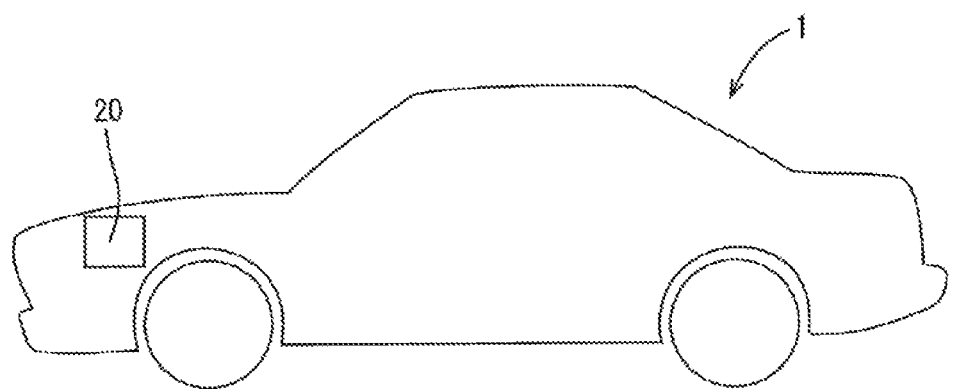
FIG. 1 is a side view of an automobile according to the first embodiment.

A measurement apparatus measures a current of an electrochemical device connected, via a first switch, to a terminal portion to which a load is connected. The apparatus includes a current limiting unit provided in a bypass path of the first switch, a current sensor configured to measure the current of the electrochemical device, and a processing unit. The current limiting unit allows power supply to the load through the bypass path when a voltage difference between a voltage of the electrochemical device and a voltage of the terminal portion is not less than a predetermined value, and makes the bypass path currentless when the voltage difference is less than the predetermined value. The processing unit performs measurement processing of measuring an offset error of the current sensor during a period until the voltage difference reaches the predetermined value due to a change in voltage of the terminal portion caused by discharging of a charge-discharge device connected in parallel with the load after the first switch is turned off.

In this configuration, when the first switch is switched from on to off, the main path becomes non-conductive and the current from the electrochemical device to the load is cut off. When the current from the electrochemical device is cut off, the charge-discharge device connected in parallel with the load is discharged, and the current flows through the load. When the charge-discharge device discharges, the voltage of the terminal portion changes. During the period until the voltage difference between the terminal portion and the electrochemical device reaches a predetermined value, the current limiting unit keeps the bypass path currentless. Therefore, the offset error of the current sensor can be detected during the period in which the bypass path is currentless. When the voltage difference from the energy storage device reaches a predetermined value, the current limiting unit permits power supply to the load through the bypass path. Therefore, power can be supplied from the electrochemical device to the load through the bypass path.

In this configuration, even if the first switch is switched from on to off to cut off the main path, the power supply path from the electrochemical device to the load is not cut off because the bypass path is provided. Moreover, during an offset error measurement period, the bypass path becomes currentless, but the charge-discharge device discharges to the load. Therefore, it is possible to measure an offset error without causing power failure (power interruption to the load).

The electrochemical device is an energy storage device that supplies power to a vehicle load that does not allow power interruption, and the processing unit switches the first switch from on to off during parking of the vehicle and executes the measurement processing.

Vehicle loads highly relevant to the safety of the vehicle, such as the engine starter, the starting device for the EV drive system, the electronic control unit such as the vehicle ECU, and the auxiliary equipment for operating the drive unit (the engine or main drive motor for the EV), are required not to cause power failure not only while the vehicle is running or stopped but also while the vehicle is parked. That is, regardless of the state of the vehicle, it is required not to allow the power to be cut off (that is, to always be supplied with power). With this configuration, it is possible to measure an offset error of a vehicle load that does not allow such power interruption without causing power failure, and hence it is possible to meet the demand for ensuring safety.

In this configuration, an offset error is measured during parking, when the vehicle is less susceptible to a dangerous event than when the vehicle is running or stopped. Measuring an offset error during parking eliminates the necessity to measure an offset error while the vehicle is running or stopped, thereby securing high safety of the vehicle. In addition, the current flowing through the vehicle load is smaller during parking than during running or stopping. Therefore, a current limiting unit having a small rated capacity can be used.

The bypass path may be provided with a second switch in series with the current limiting unit. With this configuration, the bypass path can be cut off by turning off the second switch when no offset error is measured. Interrupting the current at the time of no measurement can prevent failure in the current limiting unit, and hence can improve the offset error measurement accuracy.

The current limiting unit is preferably a diode. A diode is suitable as a current limiting element because it switches between energization and deenergization depending on the voltage difference. It is possible to determine conduction or non-conduction by detecting the voltage difference across the diode, and it is possible to accurately measure an offset error by performing measurement processing during a non-conduction period.

First Embodiment

1. Description of Battery

Figure 2:
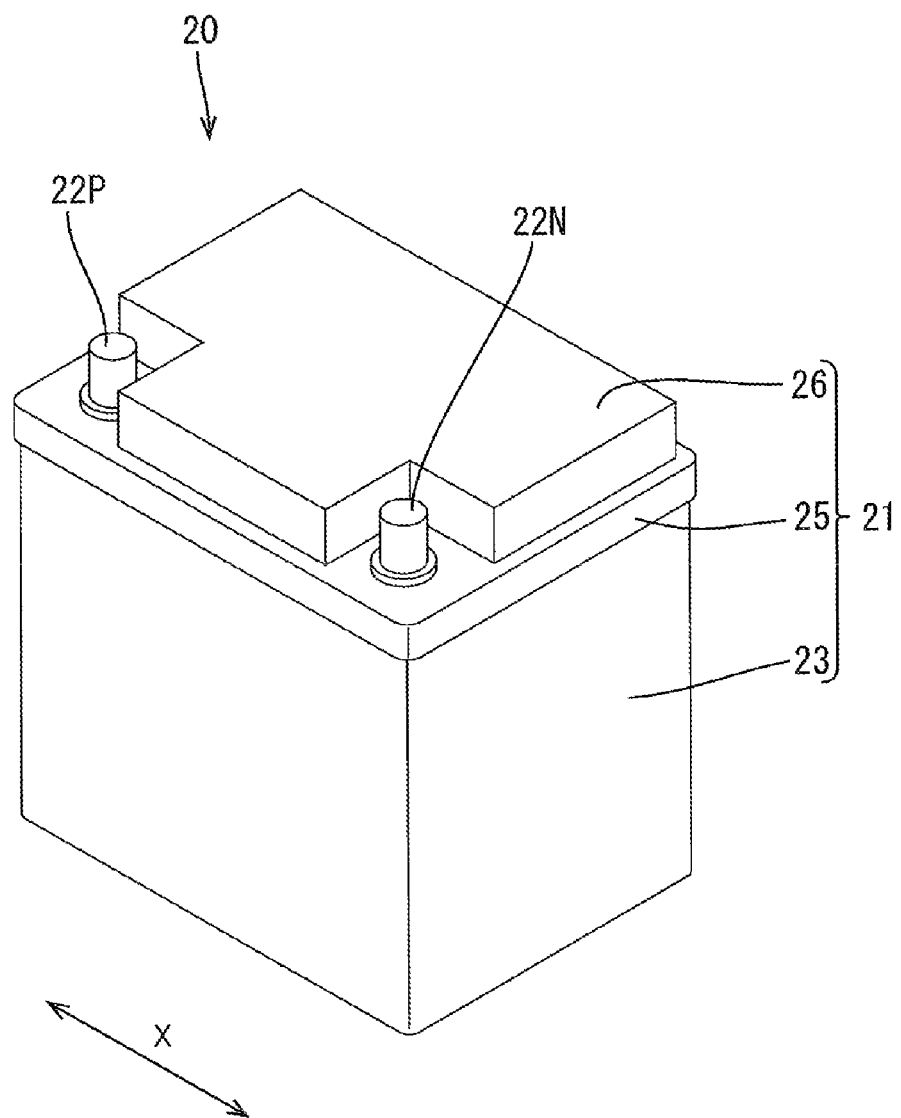
FIG. 2 is a perspective view of a battery.
Figure 3:
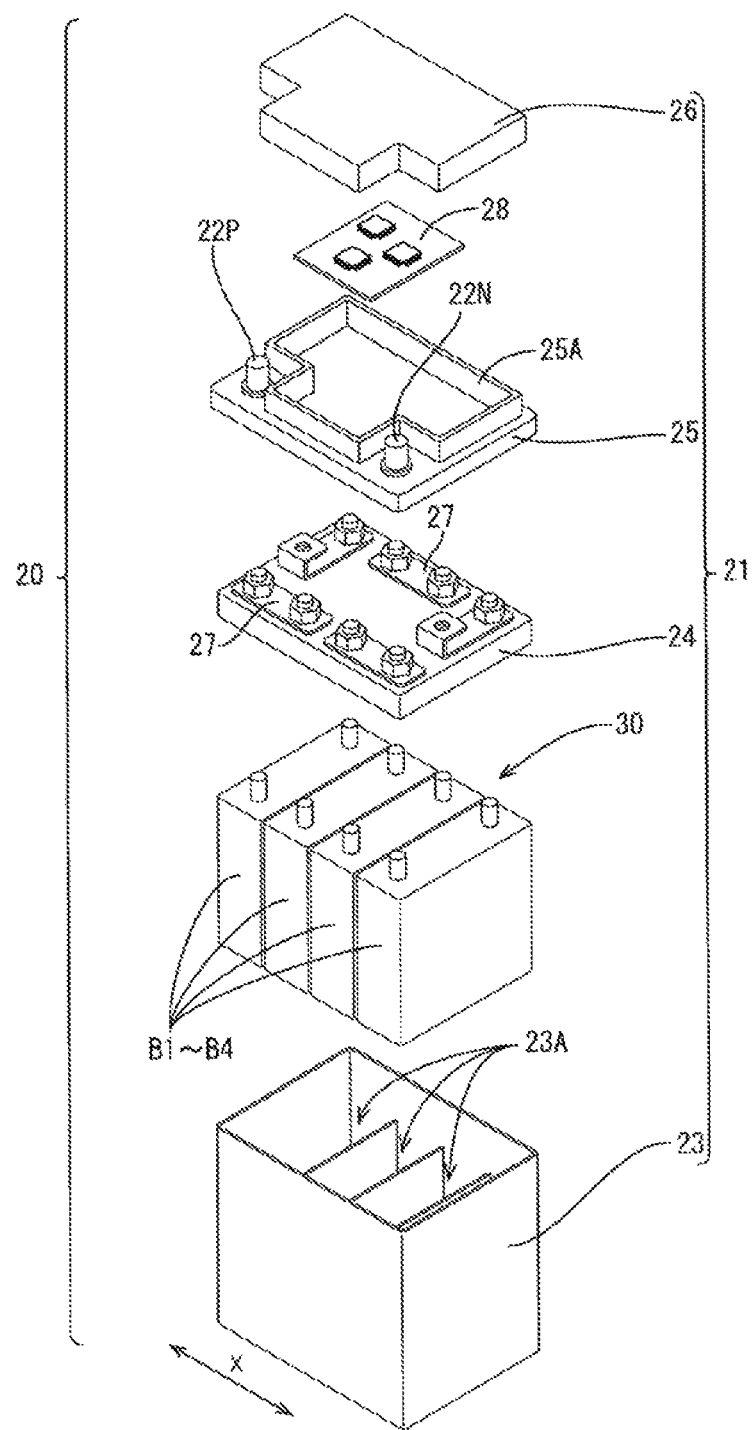
FIG. 3 is an exploded perspective view of a battery.
Figure 4:
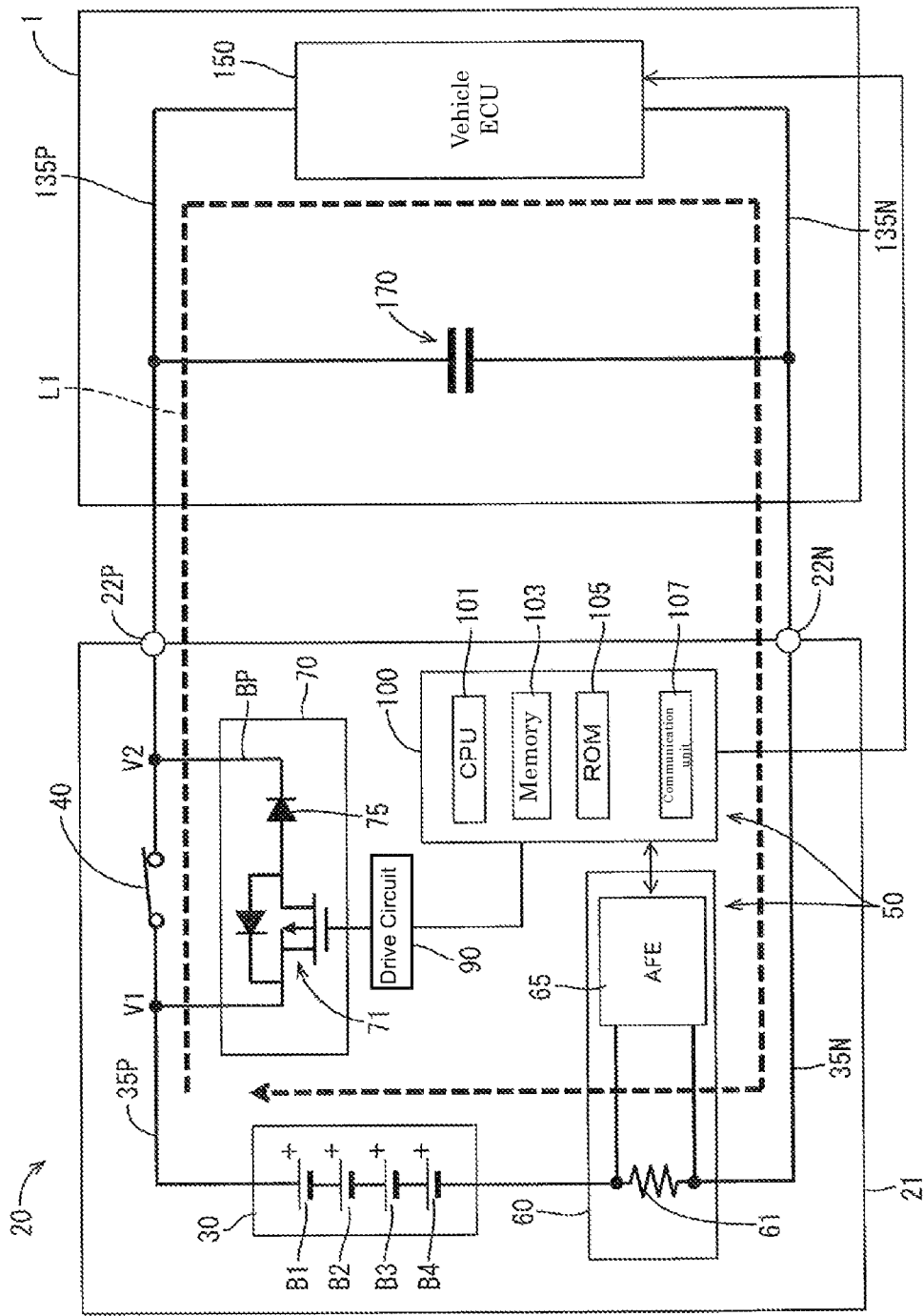
FIG. 4 is a block diagram showing the electrical configuration of the battery.
Figure 5:
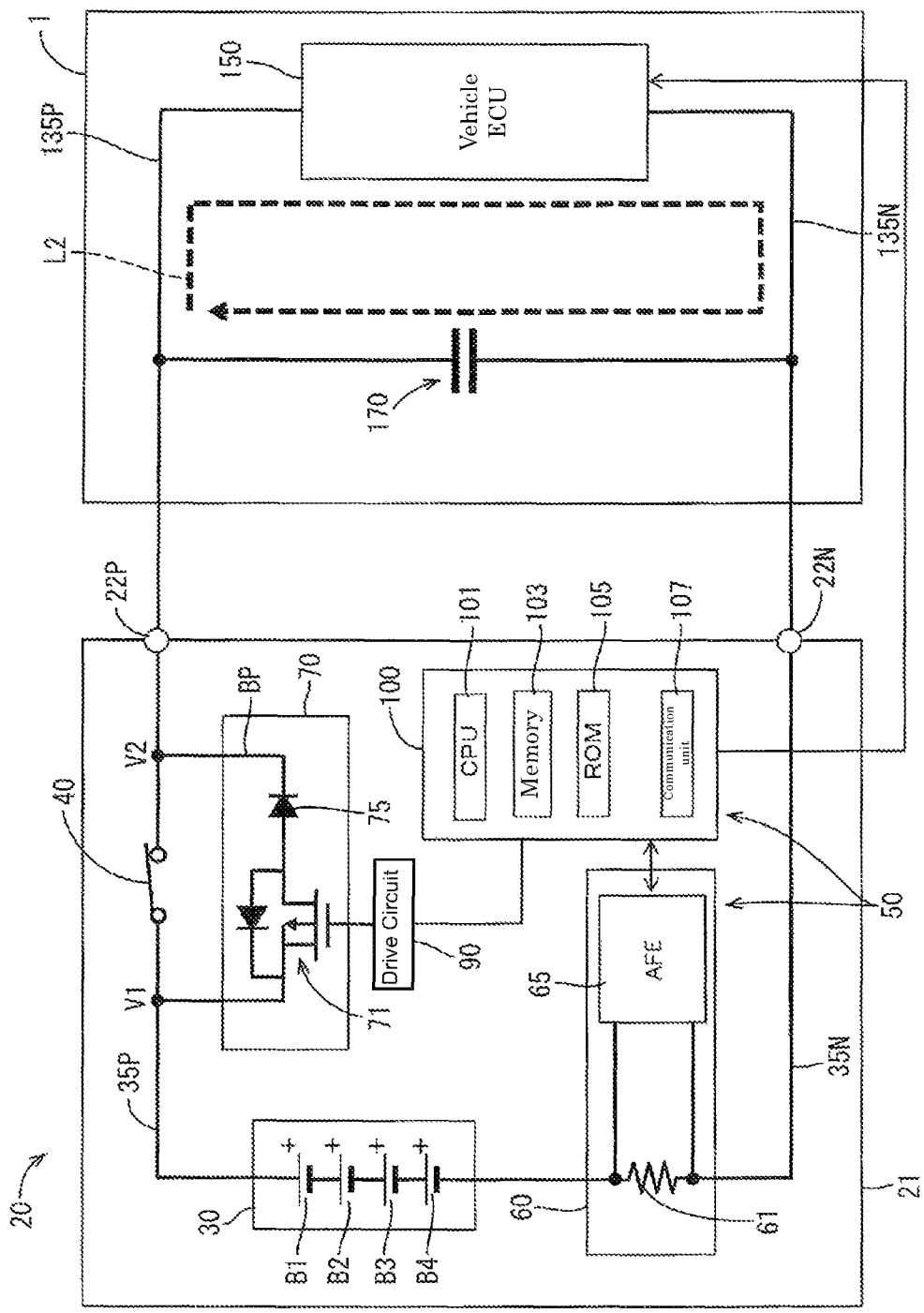
FIG. 5 is a diagram showing a current path to a vehicle ECU immediately after the first switch is turned off.

FIG. 1 is a side view of an automobile. FIG. 2 is a perspective view of a battery. FIG. 3 is an exploded perspective view of the battery. FIG. 4 is a block diagram showing the electric configuration of the battery.

The automobile 1, which is a higher-level system, is an engine-driven vehicle equipped with an engine. As shown in FIG. 1, the automobile 1 includes a battery 20 that is an energy storage apparatus. As shown in FIG. 2, the battery 20 has a block-shaped battery case 21. The battery case 21 accommodates an assembled battery 30 including a plurality of secondary batteries B1 to B4 and a circuit board 28. The battery case 21 corresponds to the "container" according to the present invention.

As shown in FIG. 3, the battery case 21 includes a box-shaped case main body 23 that opens upward, a positioning member 24 that positions the plurality of secondary batteries B1 to B4, and an inner lid 25 and an upper lid 26 which are mounted on the upper part of the case main body 23. In the case main body 23, as shown in FIG. 3, a plurality of cell chambers 23A for individually accommodating the respective secondary batteries B1 to B4 are provided side by side in the X direction.

As shown in FIG. 3, the positioning member 24 has a plurality of bus bars 27 disposed on the upper surface. The positioning member 24 is disposed on the upper part of the plurality of secondary batteries B1 to B4 disposed in the case main body 23 so as to position the plurality of secondary batteries B1 to B4 and connect them in series via the plurality of bus bars 27.

The inner lid 25 has a substantially rectangular shape in plan view, as shown in FIG. 2. At both end portions of the inner lid 25 in the X direction, a pair of terminal portions 22P and 22N to which a harness terminal (not shown) is connected are provided. The pair of terminal portions 22P and 22N are made of, for example, a metal such as a lead alloy. The terminal portion 22P is a positive electrode terminal portion and the terminal portion 22N is a negative electrode terminal portion.

On the upper surface of the inner lid 25, an accommodation portion 25A is provided. The circuit board 28 is accommodated inside the accommodation portion 25A of the inner lid 25. When the inner lid 25 is attached to the case main body 23, a secondary battery B and the circuit board 28 are connected. Further, the upper lid 26 is mounted on the upper part of the inner lid 25 so as to close the upper surface of the accommodation portion 25A accommodating the circuit board 28.

The electrical configuration of the battery 20 will be described with reference to FIG. 4. The battery 20 is a 12-V system for a vehicle, and has an assembled battery 30, a first switch 40, and a measurement apparatus 50.

The assembled battery 30 includes four lithium ion secondary batteries B1 to B4 connected in series. The lithium ion secondary batteries B1 to B4 each are an example of the "electrochemical device (energy storage device)" according to the present invention.

The positive electrode of the assembled battery 30 is connected to the positive electrode side terminal portion 22P via the first switch 40. The negative electrode of the assembled battery 30 is connected to the negative electrode side terminal portion 22N via a current detection resistor 61. Reference numeral 35P denotes a positive electrode side energization path of the assembled battery 30, and reference numeral 35N denotes a negative electrode side energization path of the assembled battery 30.

The first switch 40 is a switch that shuts off current to the assembled battery 30, and can be formed from a relay, a FET, or the like. The first switch 40 is arranged on the circuit board 28 and is accommodated in the battery case 21.

The measurement apparatus 50 is the entire apparatus that measures the current of the assembled battery 30, and includes a current sensor 60, a parallel circuit 70, and a processing unit 100. The measurement apparatus 50 is arranged on or near the circuit board 28 and accommodated in the battery case 21.

The current sensor 60 includes the current detection resistor 61 and an AFE (Analog Front End) 65. The current detection resistor 61 is arranged in the energization path 35N on the negative electrode side of the assembled battery 30 in the battery case 21. The current detection resistor 61 is arranged on or near the circuit board 28.

The AFE 65 detects the voltage across the current detection resistor 61 and changes the analog value to a digital value. The AFE 65 is connected to the processing unit 100 via a signal line. The AFE 60 is arranged on the circuit board 28.

The parallel circuit 70 is on a bypass path BP of the first switch 40 and is connected in parallel with the first switch 40. The parallel circuit 70 includes a second switch 71 and a diode 75. The FET 71 and the diode 75 are connected in series. The parallel circuit 70 is provided on the circuit board 28.

The second switch 71 is a P-channel field effect transistor whose source is connected to the positive electrode of the assembled battery 30 and whose drain is connected to the anode of the diode 75. The forward direction of the diode 75 coincides with the discharging direction of the assembled battery 30. The diode 75 has an anode connected to the drain of the second switch 71 and a cathode connected to the positive electrode side terminal portion 22P. Reference numeral 90 shown in FIG. 4 denotes a drive circuit that drives the second switch 71.

The processing unit 100 includes a CPU (central processing unit) 101 having a calculation function, a memory 103, a ROM 105, and a communication unit 107 and is arranged on the circuit board 28.

The CPU 101 sends commands to the first switch 40 and the second switch 71 to ON/OFF-control the first switch 40 and the second switch 71. "ON" means close (closed circuit), and "OFF" means open (open circuit).

The CPU 101 performs the process of detecting the current I of each of the lithium ion secondary batteries B1 to B4 based on an output from the AFE 65, and the processing of estimating the SOC of each of the lithium ion secondary batteries B1 to B4 based on the detected current I.

An SOC (state of charge) is the ratio of the remaining capacity to the full charge capacity and is represented by equation (1) given below. An SOC can be estimated based on the integral value of the current I with respect to time as indicated by equation (2) given below. The sign of current is positive at the time of charging, and negative at the time of discharging.

$$SOC = Cr/Co \times 100 \quad (1)$$

where Co is the full charge capacity of the secondary battery, and Cr is the remaining capacity of the secondary battery.

$$SOC = SOCo + 100 \times \int I dt / Co \quad (2)$$

where SOCo is the initial value of the SOC, and I is the current.

Figure 10:
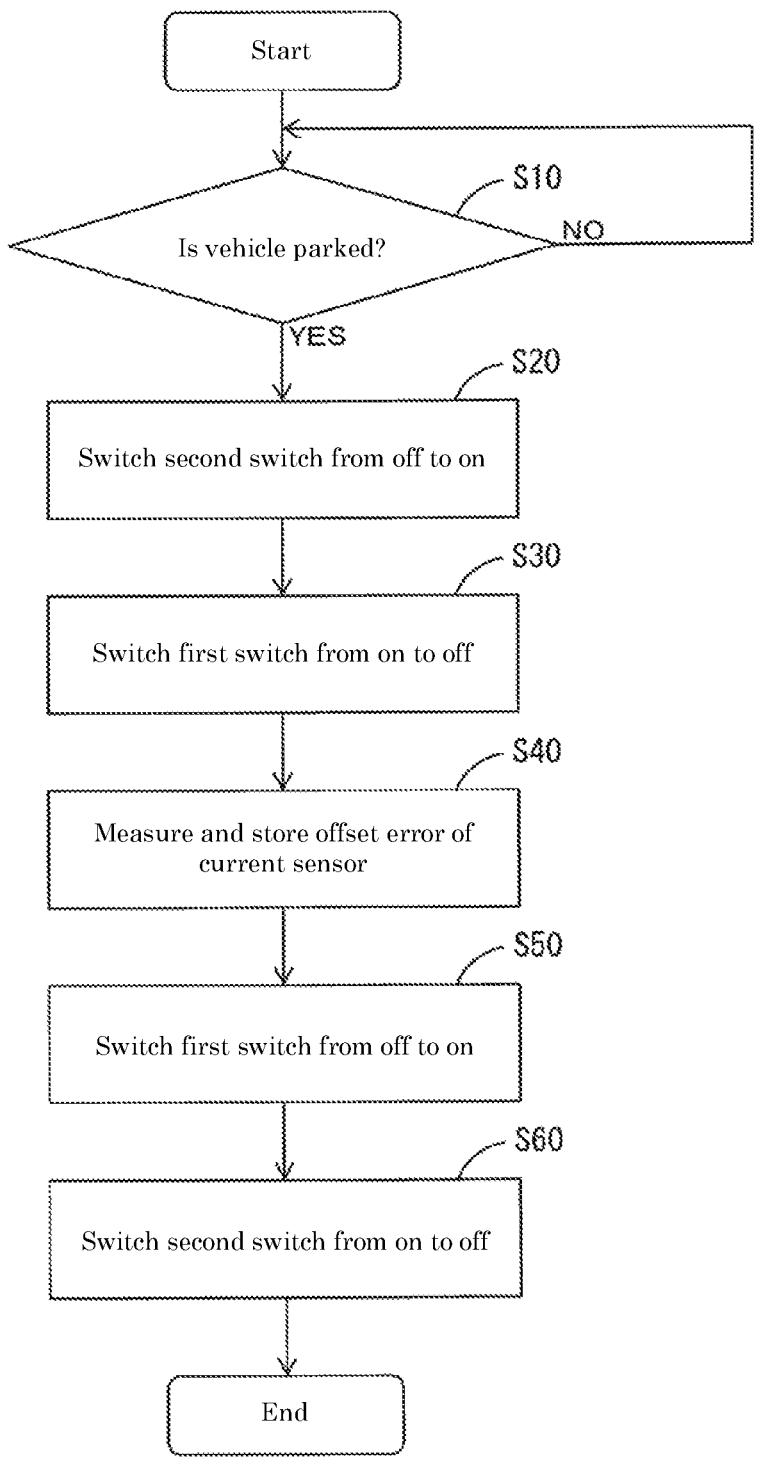
FIG. 10 is a flowchart showing an offset error measurement procedure.

The ROM 105 stores a program for estimating an SOC and a program for executing a measurement procedure for an offset error ε (steps S10 to S60 shown in FIG. 10). The program can be stored in a recording medium such as a CD-ROM and transferred. The program can also be distributed by using a telecommunication circuit.

The communication unit 107 is provided for communication with a vehicle ECU (Electronic Control Unit) 150 mounted in the automobile 1. The vehicle ECU 150 is a vehicle load that does not allow power interruption regardless of the state of the vehicle such as a running state, stopping state, and parking state. After being mounted on the vehicle, the communication unit 107 is connected to the vehicle ECU 150 via a signal line, and the processing unit 100 can receive information about the vehicle such as the operating state (stopped or driven) of the engine from the vehicle ECU 150.

As shown in FIG. 4, the vehicle ECU 150 is connected to the battery 20 via power supply lines 135P and 135N, and power is supplied from the battery 20 to the vehicle ECU 150. The vehicle ECU 150 is provided with a capacitor 170. The capacitor 170 is provided between the power supply line 135P on the positive electrode side and the power supply line 135N on the negative electrode side, and is connected in parallel with the vehicle ECU 150. The capacitor 170 is provided to stabilize the power supply voltage of the vehicle ECU 150. The capacitor 170 plays a role of discharging and supplying power to the vehicle ECU 150 during a period in which the offset error ε of the current sensor 60 is measured. The capacitor 170 corresponds to the "charge-discharge device" according to the invention.

Because the battery 20 includes the lithium ion secondary batteries B1 to B4, the battery case 21 that accommodates the lithium ion secondary batteries B1 to B4, the first switch 40, and the measurement apparatus 50, and corresponds to the "energy storage apparatus" according to the present invention. The assembled battery 30 and the measurement apparatus 50 of the battery 20 correspond to the "measurement system" according to the present invention.

2. Offset Error ε of Current Sensor 60 and Correction

The current sensor 60 has the offset error ε indicating a numerical value other than zero even when the true value is zero. The offset error ε can be measured by detecting the measurement value of the current sensor 60 (the output value from the AFE 65) while a current I of the assembled battery 30 is cut off. However, in order to measure the offset error ε, if the current I is cut off, the power supply to the vehicle ECU 150 is interrupted.

In this configuration, the capacitor 170 discharges after the first switch 40 is turned off. Because discharging lowers the voltage of the capacitor 170, a voltage V2 of the terminal portion 22P drops. During a period $T_{23}$ until a voltage difference ΔV between the voltage V2 of the terminal portion 22P and a voltage V1 of the positive electrode of the assembled battery 30 reaches a predetermined value Vx, a diode 75 is non-conductive. The offset error ε of the current sensor 60 is measured by paying attention to the fact that the current I of the assembled battery 30 is cut off during the period $T_{23}$ in which the diode 75 is non-conductive.

A method of measuring the offset error ε will be described below with reference to FIGS. 4 to 9. First, the processing unit 100 controls the first switch 40 to be in the ON state and the second switch 71 to be in the OFF state in normal times (when the offset error ε is not measured). As a result, as shown in FIG. 4, a current flows from the assembled battery 30 to the vehicle ECU 150 through a main path L1 via the first switch 40.

The capacitor 170 connected in parallel with the vehicle ECU 150 is charged, and the voltage V2 of the positive electrode side terminal portion 22P of the battery 20 becomes equal to the positive electrode side voltage V1 of the assembled battery 30 (V2=V1).

Figure 8:
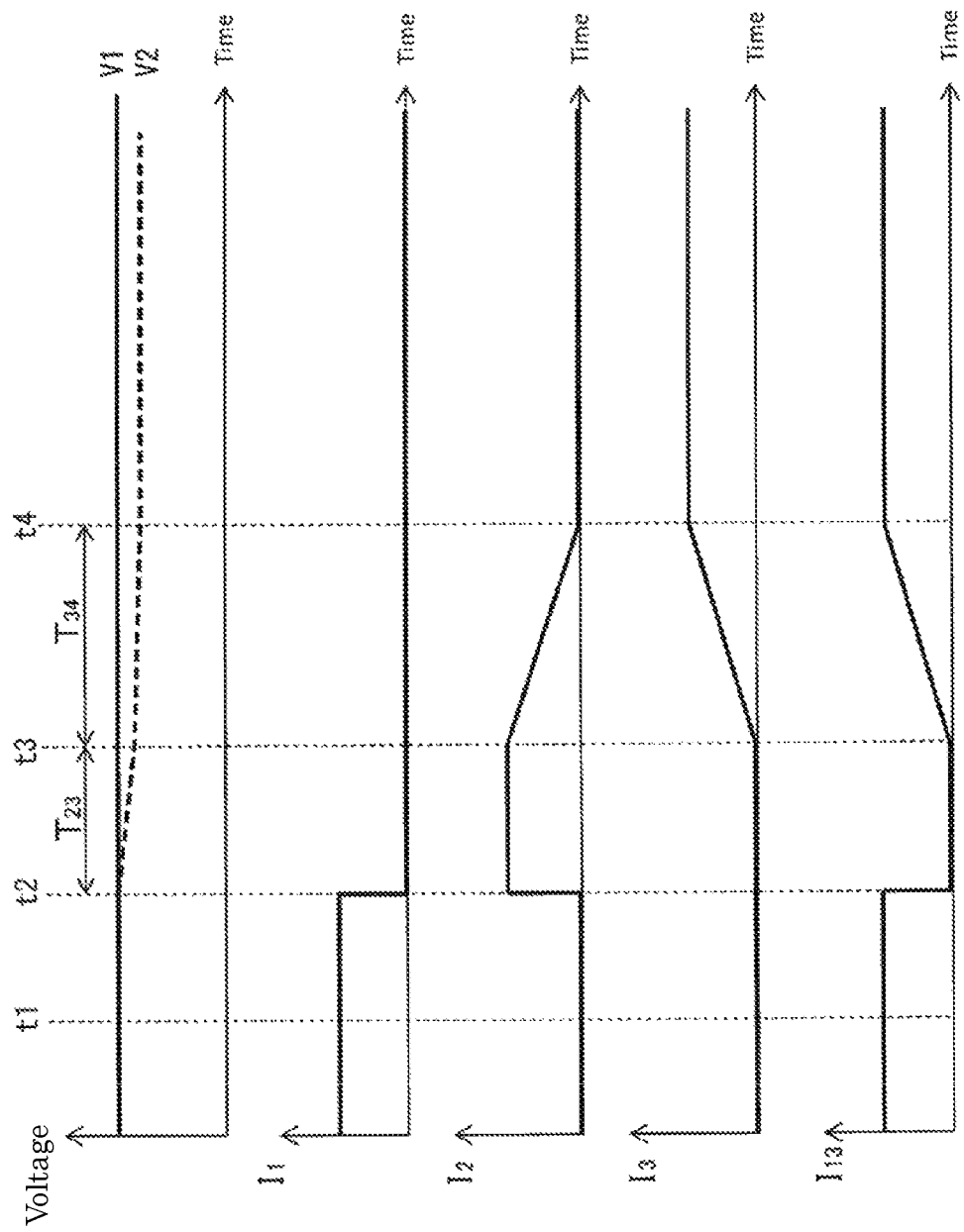
FIG. 8 is a chart showing current and voltage waveforms.

When measuring the offset error ε, the processing unit 100 switches first the second switch 71 from off to on (at time t1 shown in FIG. 8), and then switches the first switch 40 from on to off (at time t2 shown in FIG. 8). The second switch 71 may be turned on at least when measuring the offset error ε, and may be always turned on.

"$I_1$" shown in FIG. 8 indicates a current flowing through the main path L1, "$I_2$" indicates a current discharged by the capacitor 170, and "$I_3$" indicates a current flowing through the current path L3. "$I_{13}$" indicates the sum current of "$I_1$" and "$I_3$", and is the discharge current from the assembled battery 30 to the vehicle ECU 150.

At time t2, when the first switch 40 switches from on to off, the main path L1 is cut off, and the capacitor 170 starts discharging. Therefore, a current flows from the capacitor 170 to the vehicle ECU 150 through the current path L2 shown in FIG. 5. Because the voltage of the capacitor 170 drops due to discharging, as shown in FIGS. 8 and 9, the voltage V2 of the positive electrode side terminal portion 22P of the battery 20 drops and a voltage difference Δ occurs between the voltage V2 and the positive electrode side voltage V1 of the assembled battery 30 after the switching of the first switch 40.

$$\Delta V = V1 - V2 \quad (3)$$

Figure 6:
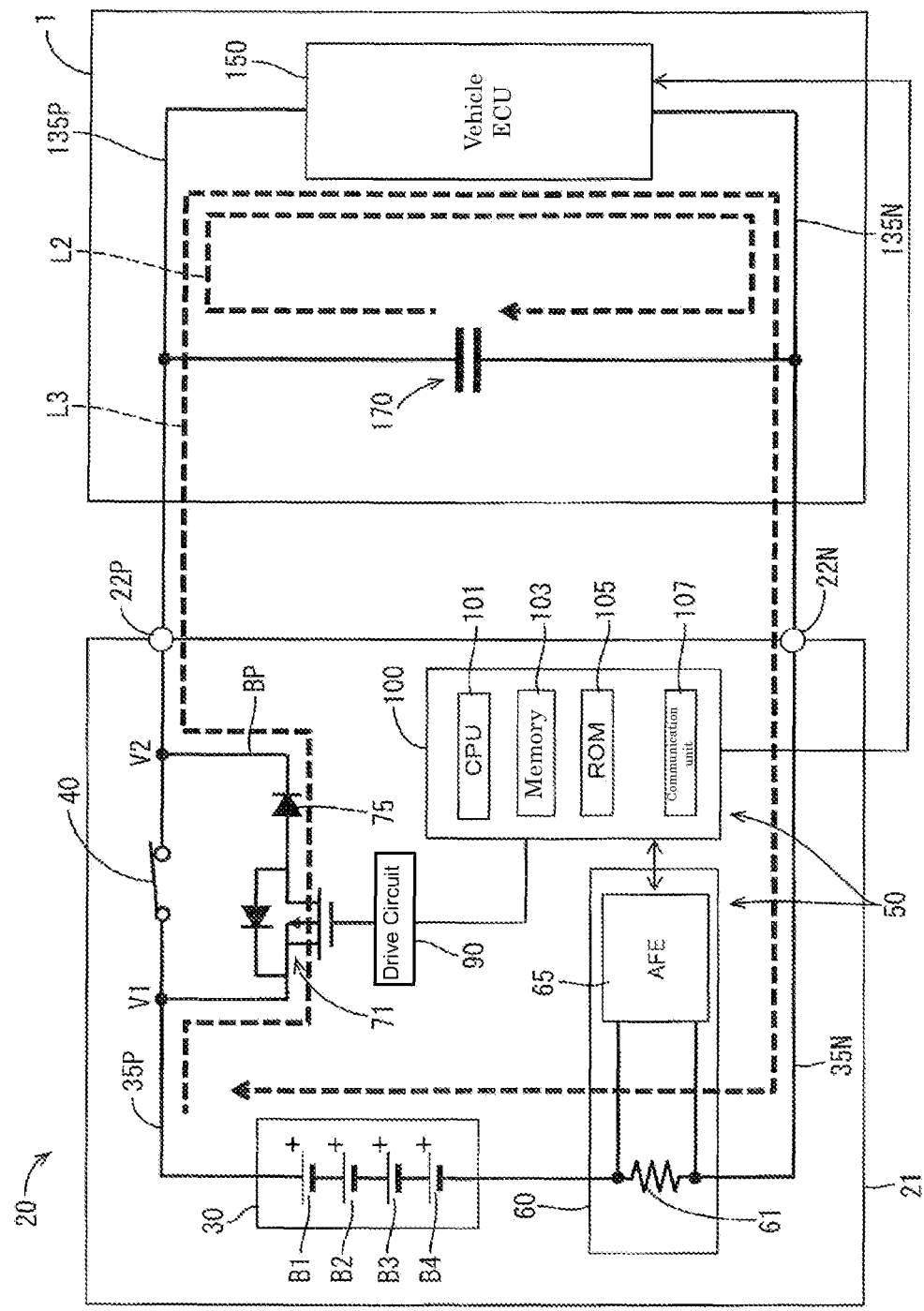
FIG. 6 is a diagram showing a current path to the vehicle ECU when the diode is conducting.
Figure 7:
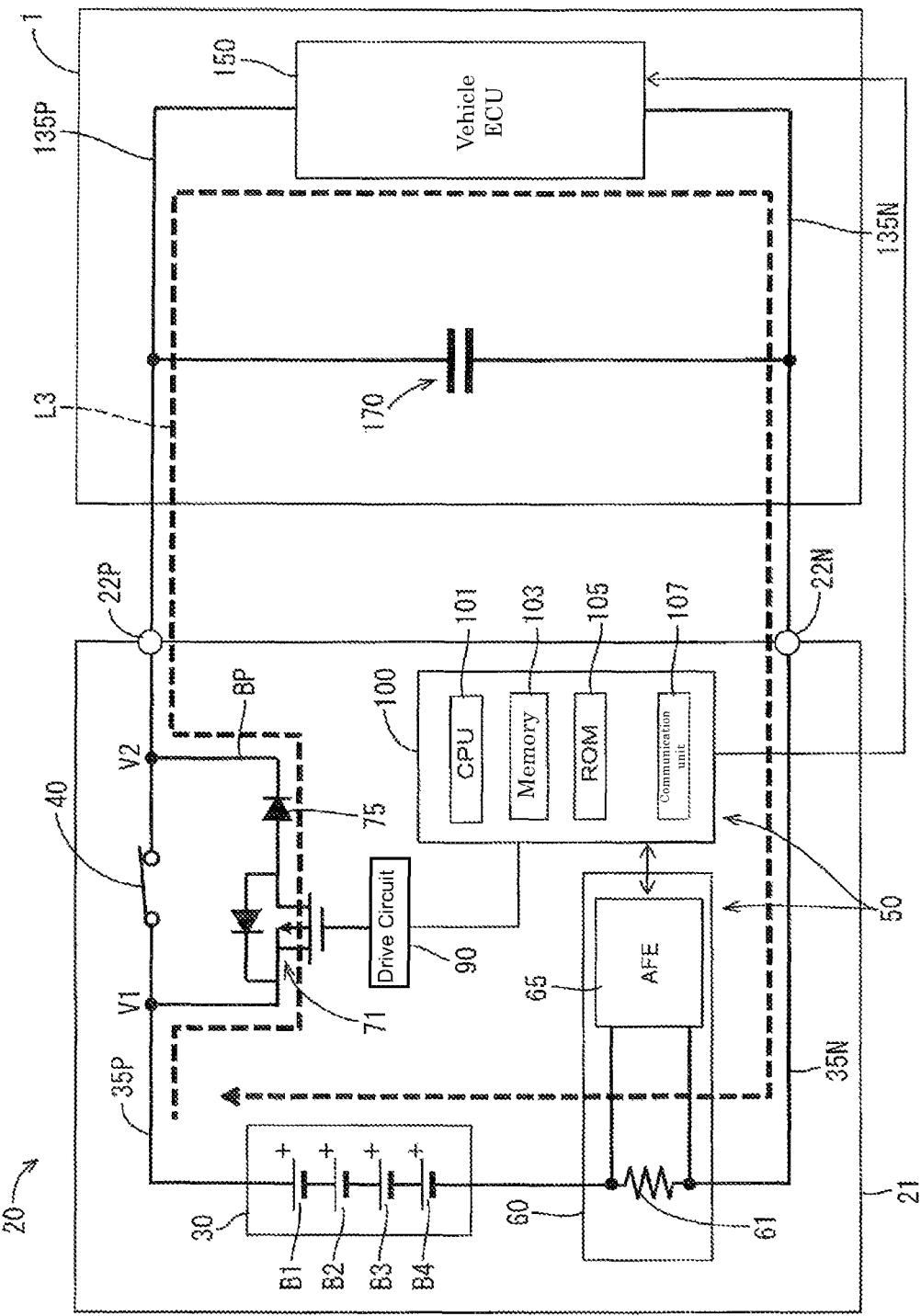
FIG. 7 is a diagram showing a current path to the vehicle ECU when the diode reaches the forward voltage.
Figure 9:
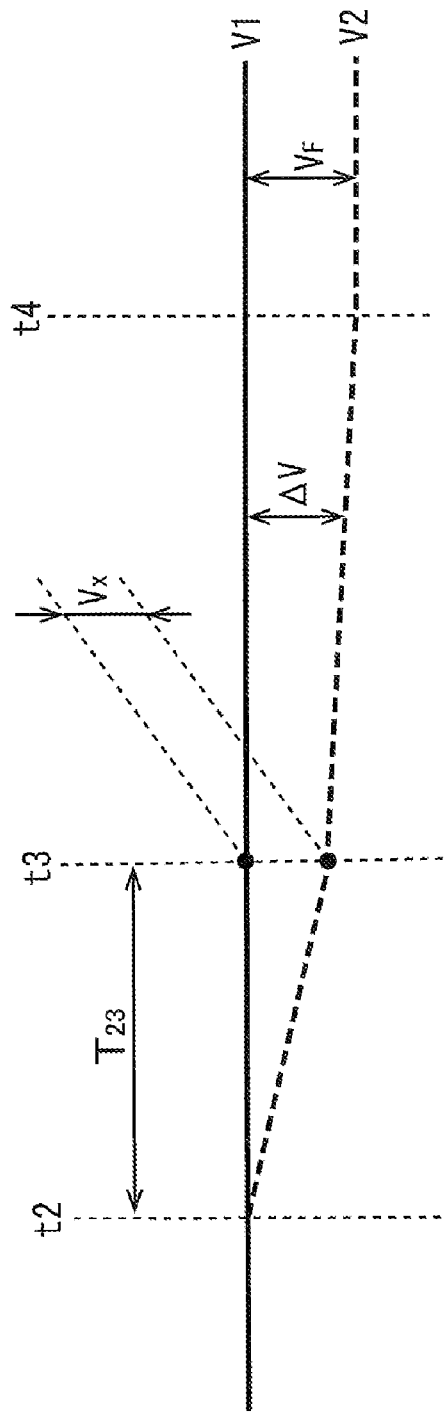
FIG. 9 is an enlarged view of part of FIG. 8.

At time t3 shown in FIGS. 8 and 9, when the voltage difference Δ reaches the predetermined value $V_X$ (0.55 V as an example), the diode 75 is turned on. When the diode 75 is turned on, power is allowed to be supplied to the vehicle ECU 150 through the bypass path BP. As shown in FIG. 6, a current flows to the vehicle ECU 150 through the current path L2 having the capacitor 170 as a power source and the current path L3 that passes from the assembled battery 30 to the parallel circuit 70 (bypass path BP).

After the diode 75 is turned on, the current flowing through the current path L3 increases and a current L2 flowing through the current path L2 decreases as the voltage difference ΔV increases. In the case shown in FIG. 8, at time t4 when the voltage difference ΔV reaches the forward voltage Vf of the diode 75 (0.6 V as an example), the current in the current path L2 becomes zero. After that, power is supplied to the vehicle ECU 150 via the current path L3 passing through the diode 75.

During the period $T_{23}$ from time t2 when the first switch 40 is turned off to time t3 when the diode 75 becomes conductive, the diode 75 is non-conductive and no current is output from the assembled battery 30. Detecting the measurement value of the current sensor 60 (the output from the AFE 65) during the period $T_{23}$ can measure the offset error ε of the current sensor 60.

The diode 75 conducts to allow power to be supplied to the vehicle ECU 150 through the bypass path BP when the voltage difference ΔV is equal to or greater than the predetermined value Vx, and becomes non-conductive to make the bypass path BP currentless when the voltage difference ΔV is less than the predetermined value Vx. Therefore, the diode 75 corresponds to the "current limiting unit" according to the present invention.

FIG. 10 is a flowchart showing an offset error ε measurement procedure. The measurement procedure is composed of six steps S10 to S60. Before execution of the measurement procedure, it is assumed that the CPU 101 performs control to turn on the first switch 40 and turn off the second switch 71.

The CPU 101 determines first whether the vehicle 1 equipped with the battery 20 is parked (S10). The determination as to whether the vehicle is parked can be made based on the state of communication with the vehicle ECU 150. That is, when the vehicle 1 is running or stopping, communication is frequently performed in a predetermined cycle between the vehicle ECU 150 and the processing unit 100.

On the other hand, when the vehicle 1 is parked, the vehicle ECU 150 stops communication. Therefore, when communication with the vehicle ECU 100 is interrupted for a predetermined period, it can be determined that the vehicle 1 is parked.

Upon determining that the vehicle 1 is parked (S10: YES), the CPU 101 then switches the second switch 71 from off to on, and then performs the processing of switching the first switch 40 from on to off (S20, S30).

The CPU 101 then performs the measurement processing of measuring the offset error of the current sensor 60 during the period $T_{23}$ from the time when the first switch 40 is turned off to the time when the diode 75 becomes conductive, and stores the measured offset error ε in the memory 103 (S40). The length of the period $T_{23}$ can be obtained from the capacitance of the capacitor 170, the discharge current of the capacitor 170, the voltage difference Vx at which the diode 75 conducts, and the like. Experimental values can also be used.

Subsequently, the CPU 101 performs the processing of switching the first switch 40 from off to on, and then performs the processing for switching the second switch 71 from on to off (S50, S60). With the above, the offset error ε measurement procedure is completed.

The CPU 101 performs the correction processing of correcting the measurement value of the current sensor 60 by the offset error ε when measuring the current of each of the lithium ion secondary batteries B1 to B4, as indicated by equation (4) given below.

Performing this processing can improve the measurement accuracy of the current I and accurately estimate the SOCs of the lithium ion secondary batteries B1 to B4.

$$It = Io - \varepsilon \quad (4)$$

where It is the current value after correction, Io is the current value before correction, and ε is the offset error. In equation (4), the signs of the current and offset error are positive in the charging direction and negative in the discharging direction.

Referring to FIG. 10, the offset error ε is preferably updated to the latest value by repeatedly executing the offset error ε measurement procedure every predetermined period, for example, every one week. With this operation, even if the offset error ε changes due to a temperature change or the like, it is possible to reduce the influence of the change, and it is possible to further improve the measurement accuracy of the current I and the estimation accuracy of the SOC.

The parallel circuit 70 can be used as a diagnostic circuit for the close failure of the first switch 40. That is, when the first switch 40 is switched from on to off with the second switch 71 of the parallel circuit 70 turned on, if the first switch 40 is operating normally, the voltage across the first switch 40, that is, ΔV (=V1−V2), is the forward voltage VF of the diode 75. On the other hand, when the first switch 40 is stuck in the closed state, the voltage ΔV across the both ends becomes zero. Therefore, detecting the voltage ΔV across the first switch 40 can diagnose whether the first switch 40 has a close failure.

4. Description of Effect

In this configuration, even if the first switch 40 is switched from on to off to cut off the main path L1, the power supply path from the assembled battery 30 to the vehicle ECU 150 is not cut off because the bypass path BP is provided. Moreover, during the measurement period of the offset error ε, the diode 75 in the bypass path BP becomes non-conductive, and the current I of the assembled battery 30 is temporarily cut off. However, during the period $T_{23}$ in which the current I is cut off, if the capacitor 170 discharges to the vehicle ECU 150 and the diode 75 becomes conductive, then the current I can be supplied from the assembled battery 30 via the bypass path BP. Therefore, it is possible to measure the offset error ε while maintaining the power supply to the vehicle ECU 150 that does not allow power-off. With this configuration, it is possible to measure the offset error ε of a vehicle load that does not allow such power interruption without causing power failure, and hence it is possible to meet the need to ensure safety.

The processing unit 100 switches the first switch 40 from on to off and measures the offset error ε of the current sensor 60 during parking during which the vehicle 1 is less likely to fall into a dangerous situation than when the vehicle 1 is running or stopping. Measuring the offset error ε during parking eliminates the necessity to measure the offset error ε while the vehicle is running or stopping, so that high safety of the vehicle can be secured. Further, the current consumption of the vehicle ECU 150 is smaller than that when the vehicle is running or stopping, and the current flowing through the diode 75 when conducting is small. Therefore, the diode 75 having a small rated capacity can be used.

In this configuration, when the offset error ε is not measured (periods other than $T_{23}$), the CPU 101 performs control to turn off the second switch 71. Turning off the second switch 71 can cut off the bypass path BP. Interrupting the current at the time of no measurement can prevent failure in the diode 75 as the current limiting unit, and hence can improve the accuracy of measurement of the offset error ε. Further, when the assembled battery 30 has an abnormality such as over discharge, the current flowing through the bypass path BP can be interrupted by turning off the second switch 71.

Other Embodiments

The present invention is not limited to the embodiments described with reference to the above description and the drawings. For example, the following embodiments are also included in the technical scope of the present invention.

(1) The first embodiment has exemplified the measurement apparatus 50 that measures currents in the lithium ion secondary batteries B1 to B4. This technology can be widely applied to any electrochemical devices other than the lithium ion secondary batteries B1 to B4 as long as it is a measurement apparatus for measuring currents. The electrochemical device includes a secondary battery, an energy storage device such as an electric double layer capacitor, a primary battery that only discharges, a fuel cell, and a solar cell. Although the first embodiment has exemplified the configuration in which the plurality of lithium ion secondary batteries B1 to B4 are connected in series, a single cell configuration may be used.

(2) The first embodiment has exemplified the case in which the battery 20, which is an energy storage apparatus, is mounted on an engine-driven vehicle. The use of the battery 20 is not limited to the engine-driven vehicle. The battery may be mounted on an electric vehicle or a hybrid electric vehicle. This technology can be applied to energy storage apparatuses for aircraft, ships, and railways as well as for vehicles. In particular, the technology is preferably applied to a load that does not allow power interruption but may also be applied to a load that partially allow power interruption.

(3) Although the first embodiment has exemplified the configuration in which the assembled battery 30 supplies power to the vehicle ECU 150, the power supply target (vehicle load) is not limited to the vehicle ECU 150. The technology may be applied to other vehicle loads that do not allow power interruption, such as a starter motor for driving the engine and auxiliary machinery of the engine.

(4) The first embodiment has exemplified the case in which the first switch 40 and the parallel circuit 70 are provided on the positive electrode side of the assembled battery 30, while the current sensor 60 is provided on the negative electrode side of the assembled battery 30. The configuration may be reversed to provide the first switch 40 and the parallel circuit 70 on the negative electrode side of the assembled battery 30, while providing the current sensor 60 on the positive electrode side of the assembled battery 30. Assume that the first switch 40 and the parallel circuit 70 are provided at the negative electrode. In this case, when the first switch 40 is turned off, the voltage of the terminal portion 22N changes due to the discharging of the capacitor 170, and the voltage difference ΔV occurs between the negative electrode side terminal portion 22N and the negative electrode of the assembled battery 30. Until the generated voltage difference ΔV reaches the predetermined value Vx, the diode 75 is non-conductive. Accordingly, the offset error ε of the current sensor 60 can be measured during this period. When the first switch 40 and the parallel circuit 70 are provided on the negative electrode side, the voltage of the terminal portion 22N becomes higher than that of the negative electrode of the assembled battery 30 due to the discharging of the capacitor 170. Therefore, the anode and cathode of the diode 75 are respective connected to the terminal portion 22N and the negative electrode of the assembled battery 30 so as to make the discharging direction coincide with the forward direction.

Figure 11:
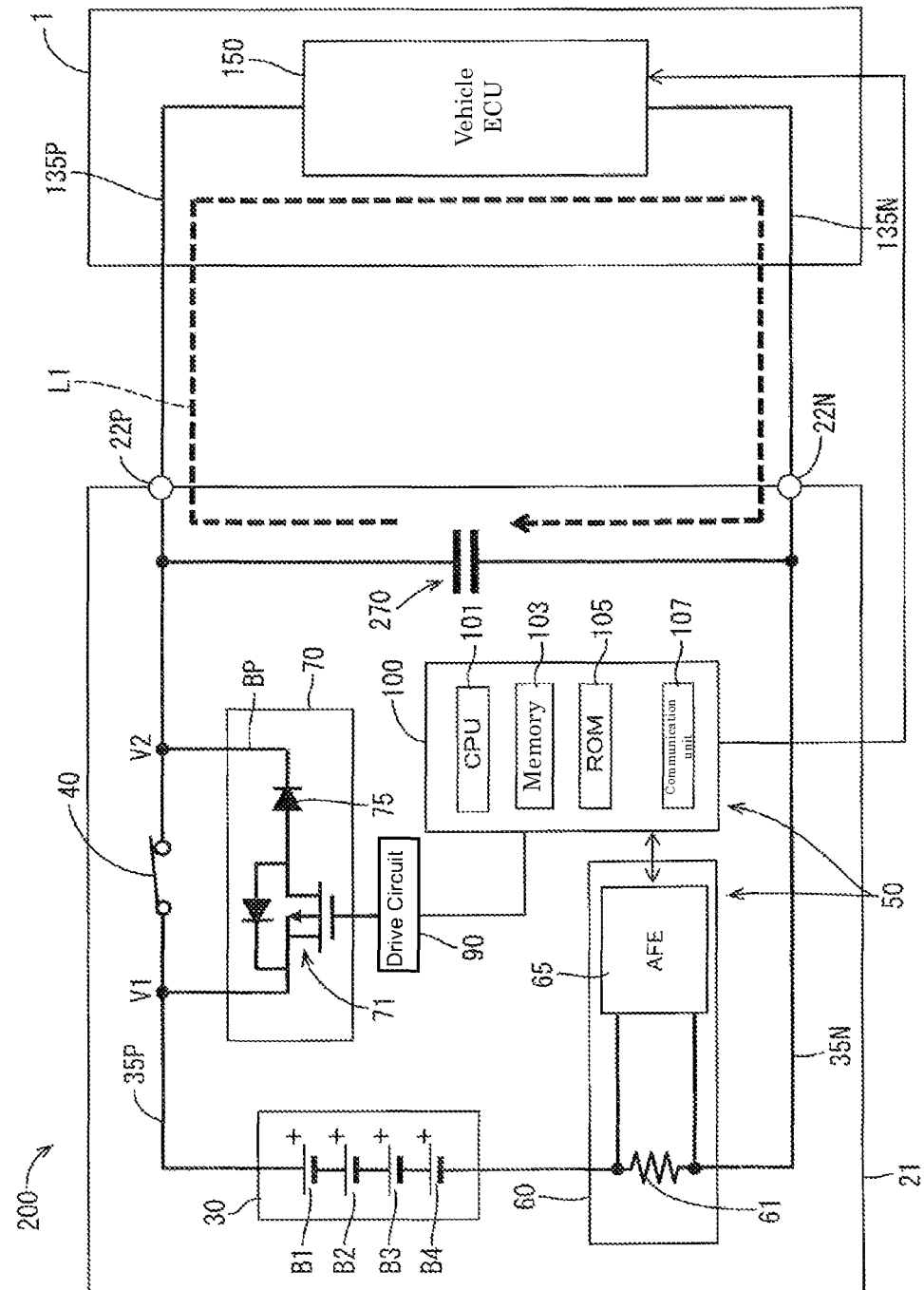
FIG. 11 is a block diagram showing another embodiment of the battery.

(5) The first embodiment has exemplified the capacitor 170 provided outside the battery. The capacitor 170 may be placed in the battery. The battery 200 shown in FIG. 11 includes the capacitor 270 inside the battery case 21. One end of the capacitor 270 is connected to the positive electrode side terminal portion 22P, and the other end is connected to the negative electrode side terminal portion 22N. The capacitor 270 is charged by the assembled battery 30. When the first switch 40 is turned off to cut off the main path L1, the capacitor 270 is discharged to supply power to the vehicle ECU 150. During the period $T_{23}$ until the voltage difference ΔV between the voltage V1 of the positive electrode of the assembled battery 30 and the terminal portion V2 on the positive electrode side reaches the predetermined value Vx due to discharging from the capacitor 270, the diode 75 is deenergized and the bypass path BP becomes currentless. Therefore, during the period $T_{23}$, the processing unit 100 can measure the offset error ε of the current sensor 60. In this configuration, because the battery 20 incorporates the capacitor 270, even if the capacitor 170 is not provided on the vehicle 1 side, the offset error ε of the current sensor 60 can be measured while power supply to the vehicle load 150 is continued. The capacitor 270 incorporated in the battery 20 plays a role of discharging to the vehicle load 150 during the period $T_{23}$ in which the processing unit 100 measures the offset error ε.

(6) The capacitors 170 and 270 may be anything that discharges when the first switch 40 is turned off, and can be substituted by a charge-discharge device such as, for example, a secondary battery.

Figure 12:
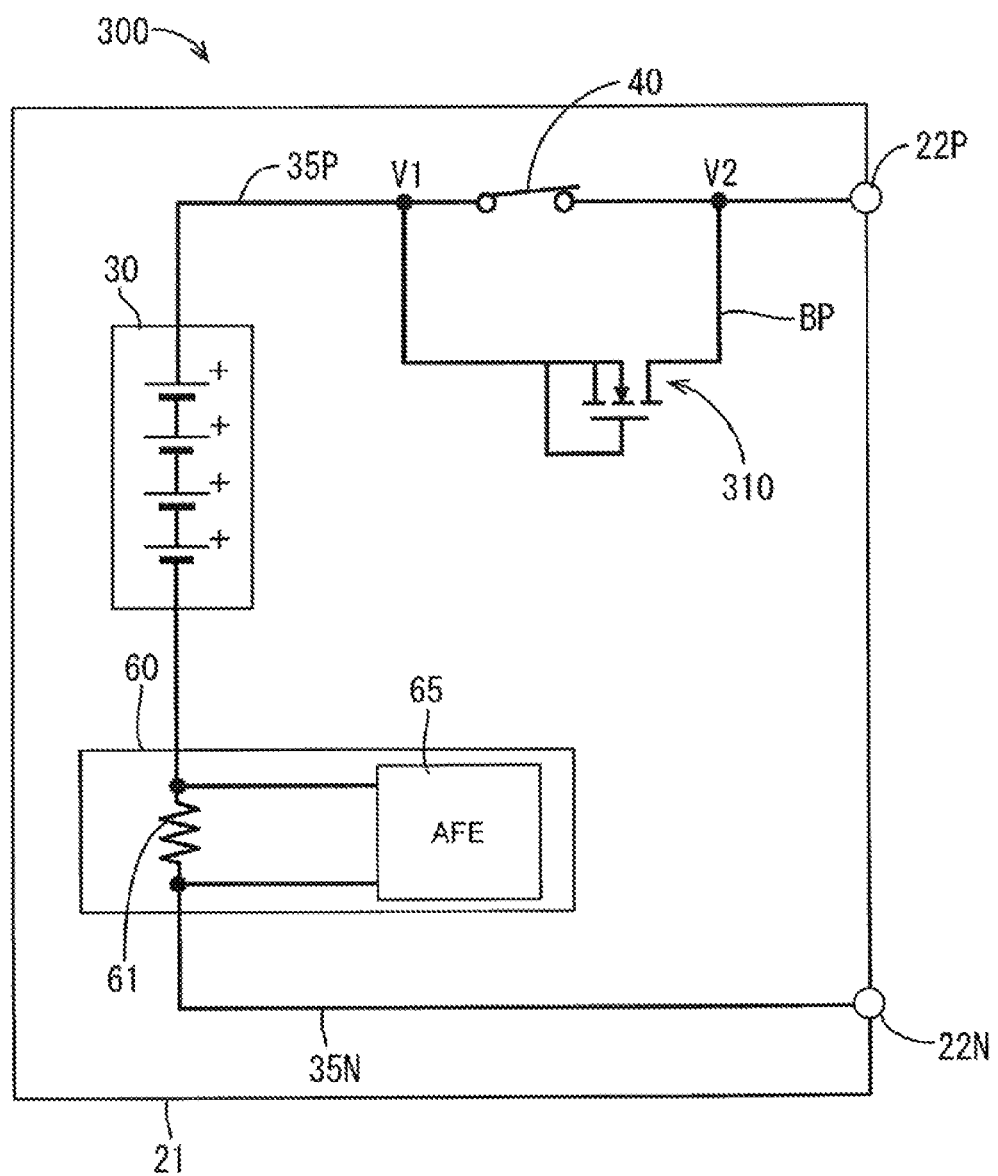
FIG. 12 is a block diagram showing another embodiment of the battery.

(7) The first embodiment has exemplified the diode 75 as a current limiting unit. The current limiting unit may be other than a diode, provided that the unit allows power supply to a load via the bypass path BP when the voltage difference ΔV between the voltage V1 of the assembled battery 30 and the voltage V2 of the terminal portion 22P is equal to or greater than the predetermined value Vx, and makes the bypass path BP currentless when the voltage difference ΔV is less than the predetermined value. In the battery 300 shown in FIG. 12, the current limiting unit is formed from the diode-connected FET 310. The diode connection is to short-circuit the gate and the source. Like the diode 75, the diode-connected FET 310 is conductive when the voltage difference is equal to or more than a predetermined value, and is non-conductive otherwise. This allows the FET 310 to substitute for the diode 75. The battery 300 in FIG. 12 does not include the second switch 71.

Figure 13:
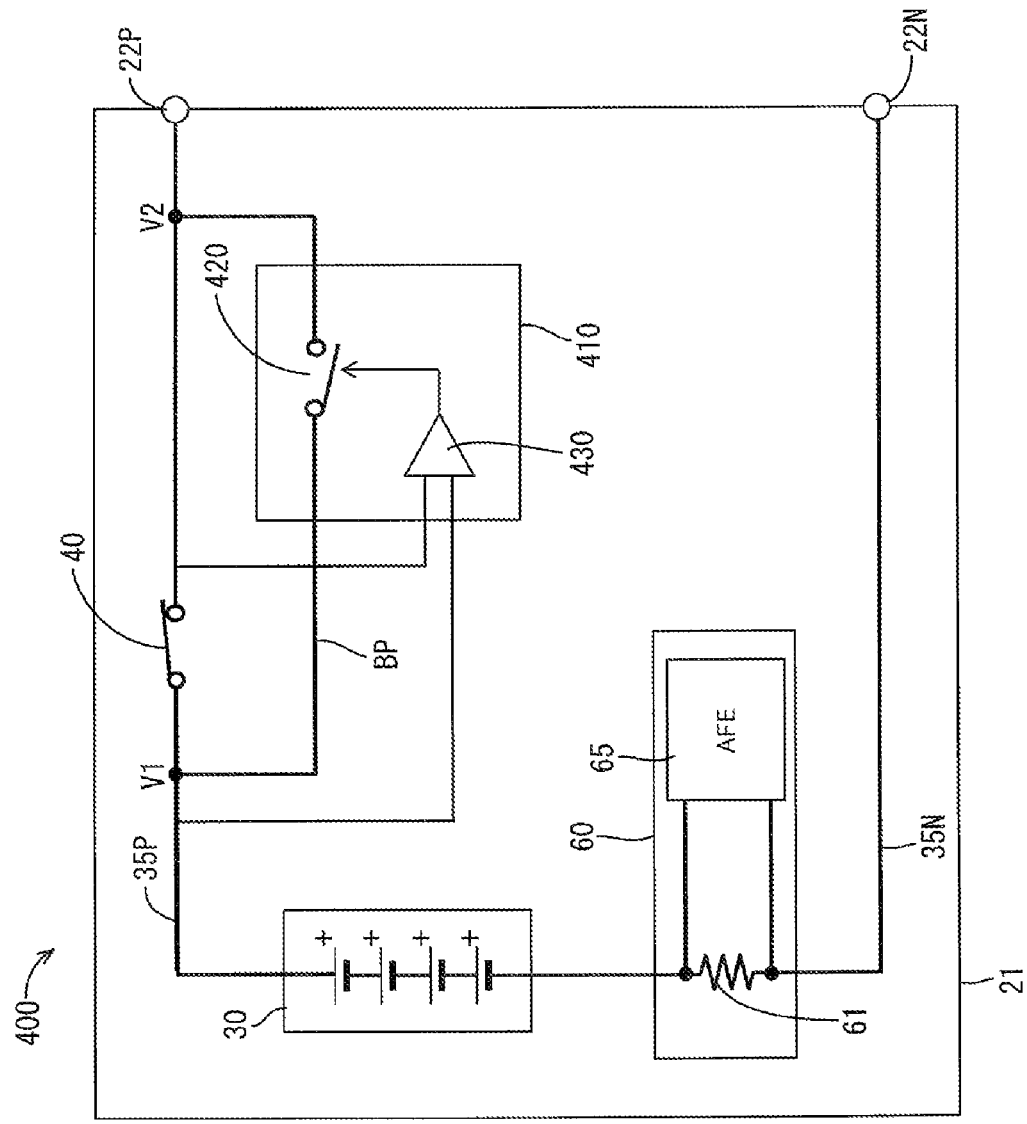
FIG. 13 is a block diagram showing another embodiment of the battery.

(8) In the battery 400 shown in FIG. 13, the current limiting unit 410 includes a third switch 420 and a comparator 430. The comparator 430 detects the voltage difference ΔV between the voltage V1 of the positive electrode of the assembled battery 30 and the voltage V2 of the positive terminal portion 22P. The comparator 430 outputs a signal that turns on the third switch 420 when the voltage difference ΔV is equal to or larger than a predetermined value, and outputs a signal that turns off the third switch 420 when the voltage difference ΔV is less than the predetermined value. Even when the current limiting unit 410 is formed from the third switch 420 and the comparator 430, the third switch 420 is turned off until the voltage difference ΔV reaches a predetermined value after the first switch 40 is turned off to make bypass path BP currentless. Accordingly, the offset error ε of the current sensor 60 can be measured during this period. Forming the current limiting unit 410 by using the third switch 420 and the comparator 430 provides the advantage of being able to arbitrarily set a threshold value (voltage difference) at which the bypass path BP switches from the non-energized state (third switch: off) to the energized state (third switch: on).

Figure 14:
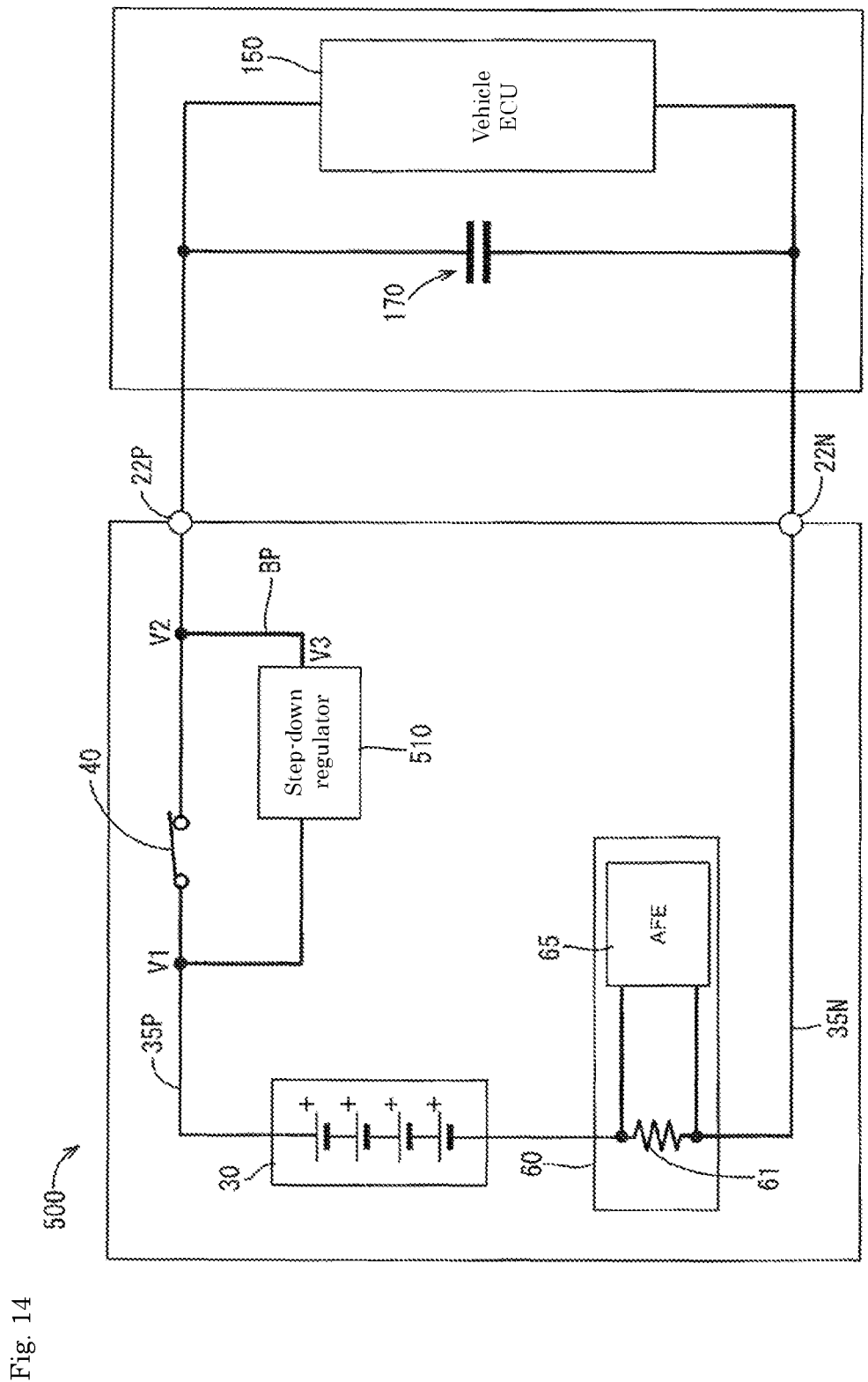
FIG. 14 is a block diagram showing another embodiment of the battery.

(9) A battery 500 shown in FIG. 14 uses a step-down regulator 510 as a current limiting unit. The step-down regulator 510 steps down the input voltage (the voltage V1 of the assembled battery) and outputs the resultant voltage. The bypass path BP becomes currentless when the voltage V2 of the positive electrode side terminal portion 22P is higher than an output voltage V3 of the step-down regulator 510. Accordingly, after the first switch 40 is turned off, the offset error ε of the current sensor 60 can be measured during a period until the voltage V2 of the positive electrode side terminal portion 22P decreases from the voltage V1 of the positive electrode of the assembled battery 30 to the output voltage V3 of the step-down regulator 510 due to the discharging of the capacitor 170. When the voltage V2 of the terminal portion 22P drops to the output voltage V3, the voltage V2 of the terminal portion 22P is maintained afterward at the output voltage V3 of the step-down regulator 510, and power can be supplied to the vehicle load 150 via the bypass path BP.

(10) In the first embodiment, the period $T_{23}$ from the time when the first switch 40 is turned off to the time when the diode 75 becomes conductive is obtained from the capacitance of the capacitor 170, the discharge current of the capacitor 170, the voltage difference Vx at which the diode 75 conducts, and the like. The diode 75 is non-conductive when the voltage difference ΔV between the voltage V2 of the terminal portion 22P and the voltage V1 of the positive electrode of the assembled battery 30 is smaller than the predetermined value Vx, and is conductive when the voltage difference reaches the predetermined value Vx. Therefore, after the first switch 40 is turned off, the voltage V2 of the terminal portion 22P and the voltage V1 of the positive electrode of the assembled battery 30 are detected to obtain the voltage difference ΔV. The offset error ε may be measured during a period until the obtained voltage difference ΔV reaches the predetermined value Vx. This makes it possible to perform measurement during the period in which the diode 75 is deenergized, thereby improving the accuracy of measurement of the offset error ε. Even when the step-down regulator 510 is used for the current limiting section, it is possible to determine the currentless period of the bypass path BP by detecting the voltage V2 of the terminal portion 22P and comparing it with the output voltage V3 from the step-down regulator.

(11) In the first embodiment, whether the vehicle 1 is parked is determined based on the state of communication with the vehicle ECU 150, but it may be determined based on the magnitude of the current I of the assembled battery 30. That is, it may be determined that the vehicle is parked when the current I is equal to or less than the predetermined value for a certain period of time. Alternatively, it may be determined from the presence or absence of vibration for a predetermined time or longer. It is advisable to detect vibrations with a sensor.

(12) In the first embodiment, the correction processing of correcting the current I of the lithium ion secondary batteries B1 to B4 is executed based on the offset error ε. Alternately, the SOC may be corrected without correcting the current I. Specifically, based on the integration time of the current I performed to calculate the SOC and the offset error c, the SOC error (the SOC error caused by the offset error ε of the current sensor 60) may corrected.

(13) As long as the measurement apparatus 50 is constituted by the current sensor 60, the parallel circuit 70, and the processing unit 100, the members 60, 70, and 80 need not necessarily be provided in the battery. The first embodiment has exemplified the configuration in which the first switch 40 and the parallel circuit 70 are provided inside the battery 20. The first switch 40 and the parallel circuit 70 may be provided outside the battery 20 as long as they are mounted on the vehicle. Similarly, the current sensor 60 and the processing unit 100 may be provided outside the battery 20 as long as they are mounted on the vehicle. That is, the battery 20 may be constituted by only lithium ion secondary batteries B1 to B4, the processing unit 100 provided outside the battery may measure the offset error ε by acquiring the data of the measurement value measured in the period $T_{23}$ from the current sensor 60.

(14) The measurement system may be any system that includes an electrochemical device such as the assembled battery 30 and the measurement apparatus 50 and measures a current in the electrochemical device 30 with the measurement apparatus 50. The physical configuration may be any configuration, such as where the electrochemical device 30 and the measurement apparatus 50 are arranged.

(15) The technique disclosed in the first embodiment can be implemented in various forms such as offset error measurement programs for a current sensor and a recording medium recording the programs.

A measurement program for the offset error ε of the current sensor 60 causes the computer 40 to execute measurement processing (S40) of measuring the offset error ε of the current sensor 60 during the period $T_{23}$ in which the current limiting device 75 makes the bypass path BP currentless after the first switch 40 connecting the terminal portion 22P and the electrochemical device 30 is turned off.

DESCRIPTION OF REFERENCE SIGNS

1: vehicle
20: battery (corresponding to "energy storage apparatus" according to present invention)
30: assembled battery 40: first switch
60: current sensor
61: current detection resistor
65: AFE
70: parallel circuit
71: second switch
75: diode (corresponding to "current limiting unit" according to present invention)
100: processing unit
101: CPU
150: vehicle ECU (corresponding to "vehicle load" according to present invention)
170: capacitor (corresponds to "charge-discharge device" according to present invention)
B1 to B4 . . . : lithium ion secondary battery (corresponding to "electrochemical device (energy storage device)" according to present invention)

The invention claimed is:

1. A measurement apparatus for measuring a current of an electrochemical device connected, via a first switch, to a terminal portion to which a load is connected, the measurement apparatus comprising:
   a current limiting unit provided in a bypass path connected in parallel with the first switch;
   a current sensor configured to measure the current of the electrochemical device; and
   a processing unit,
   wherein:
      the current limiting unit allows power supply to the load through the bypass path when a voltage difference between a voltage of the electrochemical device and a voltage of the terminal portion is not less than a predetermined value, and makes the bypass path current-less when the voltage difference is less than the predetermined value, and
      the processing unit performs measurement processing of measuring an offset error of the current sensor during a period until the voltage difference reaches the predetermined value due to a change in voltage of the terminal portion caused by discharging of a charge-discharge device connected in parallel with the load after the first switch is turned off.

2. The measurement apparatus according to claim 1, wherein:
   the electrochemical device is an energy storage device configured to supply power to a vehicle load that does not allow power interruption, and
   the processing unit switches the first switch from on to off during parking of a vehicle and executes the measurement processing.

3. The measurement apparatus according to claim 1, further comprising a second switch provided in the bypass path and connected in series with the current limiting unit.

4. The measurement apparatus according to claim 1, wherein the current limiting unit is a diode.

5. An energy storage apparatus comprising:
   an energy storage device as an electrochemical device;
   a container configured to accommodate the energy storage device;
   a terminal portion which is provided in the container and to which a load is connected;
   a first switch accommodated in the container and provided between the energy storage device and the terminal portion; and
   the measurement apparatus according to claim 1, which is accommodated in the container.

6. The energy storage apparatus according to claim 5, further comprising a charge-discharge device accommodated in the container and connected to the terminal portion.

7. The energy storage apparatus according to claim 6, wherein
   the energy storage apparatus is for a vehicle, and
   the charge-discharge device discharges, during a period in which the processing unit performs the measurement processing, to a vehicle load that does not allow power interruption.

8. A measurement system comprising:
   an electrochemical device; and
   the measurement apparatus according to claim 1.

* * * * *